(12) United States Patent
Davis

(10) Patent No.: US 8,860,508 B1
(45) Date of Patent: Oct. 14, 2014

(54) DIGITALLY CONTROLLED WIDEBAND VARIABLE GAIN AMPLIFIER

(71) Applicant: Lockheed Martin Corporation, Bethesda, MD (US)

(72) Inventor: Brandon R. Davis, Mount Laurel, NJ (US)

(73) Assignee: Lockheed Martin Corporation, Bethesda, MD (US)

(*) Notice: Subject to any disclaimer, the term of this patent is extended or adjusted under 35 U.S.C. 154(b) by 5 days.

(21) Appl. No.: 13/706,096

(22) Filed: Dec. 5, 2012

(51) Int. Cl.
*H03G 3/30* (2006.01)

(52) U.S. Cl.
CPC ........................................ *H03G 3/30* (2013.01)
USPC ......................................... 330/254; 330/311

(58) Field of Classification Search
CPC . H03G 1/0023; H03G 1/0088; H03G 1/0029; H03F 3/45183; H03F 2203/45702
USPC .................................................. 330/252–261
See application file for complete search history.

(56) References Cited

U.S. PATENT DOCUMENTS

| | | | |
|---|---|---|---|
| 6,388,502 B2 | 5/2002 | Kaneki et al. | |
| 6,426,680 B1 | 7/2002 | Duncan et al. | |
| 6,761,069 B2 | 7/2004 | Hollocher et al. | |
| 6,927,714 B1 | 8/2005 | Teterwak | |
| 6,972,625 B2 | 12/2005 | Nguyen et al. | |
| 7,482,879 B2 | 1/2009 | Koutani et al. | |
| 7,696,823 B2 | 4/2010 | Khorramabadi | |
| 7,848,724 B2 | 12/2010 | Bult et al. | |
| 7,868,665 B2 | 1/2011 | Tumer et al. | |
| 7,936,210 B2 | 5/2011 | Robinson et al. | |
| 7,960,997 B2 | 6/2011 | Williams | |
| 8,362,836 B2 * | 1/2013 | Gilbert et al. | 330/254 |
| 2002/0171489 A1 | 11/2002 | Ritchie | |

* cited by examiner

*Primary Examiner* — Hieu Nguyen
(74) *Attorney, Agent, or Firm* — Howard IP Law Group, PC

(57) ABSTRACT

A variable gain amplifier having a stacked configuration of cascode connected groups of NPN transistors is arranged in a compact schematic design. A differential radio frequency input signal is received at input nodes which is directed to a fine gain control circuit which conducts at least a portion of the received RF signal to a coarse gain control circuit that is downstream of the fine gain control circuit. The coarse gain control circuit steers current to an output node. Gain control circuits include transistor pairs. The base electrodes of each transistor pair receive inverse control signals which cause only one of the transistors in the transistor pair to conduct current. Collector electrodes of each first transistor of the pair is coupled to a downstream node in the VGA circuit, while collector electrodes of each second transistor of the pair is shunted to the voltage rail.

24 Claims, 12 Drawing Sheets

DIGITALLY CONTROLLED WIDEBAND VARIABLE GAIN AMPLIFIER

FIELD OF THE INVENTION

The disclosed circuit and method relate to integrated circuits. In particular, an integrated circuit implementing a variable gain amplifier (VGA) is described.

BACKGROUND OF THE INVENTION

In phased radar arrays, it is often desirable to control the power level of the received/transmitted signal at each element of the array. It is further desirable to control the power level at each array element with high accuracy over a large signal range and across a wide bandwidth. In addition, it is desirable that each incremental design element in a radio frequency (RF) channel have as little degradation in performance as possible while minimizing the effect of phase shifts in the incoming or outgoing signal.

Variable gain amplifiers (VGAs) have conventionally used a single level of control. For example, a VGA is described in the co-pending commonly owned patent application Ser. No. 13/306,674 filed on Nov. 29, 2011, which is incorporated by reference as if fully set forth herein. A series of differential transistor pairs are connected in parallel to steer current through the VGA circuit to control gain. The performance requirements for these VGAs has increased and calls for greater gain range and smaller gain states (i.e. finer control), in addition to operation at higher frequencies. Thus, improvements to existing designs are needed. To increase gain range, for example, multiple VGAs may be arranged in stages so that the output of a first VGA in the chain serves as the input to a next VGA circuit. However, this solution requires additional space to accommodate multiple VGA circuits, as well as creating additional power requirements. In addition, as higher gain is realized, the input signal experiences some amount of compression. Compression of the input signal is cascaded through the system, thereby being exacerbated by each progressive VGA stage. Alternative circuits and methods are desired.

SUMMARY

There is disclosed a single VGA circuit which provides higher gain range at smaller gain states which operates at higher frequencies without expanding the circuit footprint, or requiring multiple amplification stages.

A semiconductor device implementing a digitally controlled VGA receives a differential radio frequency (RF) input via a differential input pair. The RF input is received by a pair of input transistors which feed the RF input signal to a pair of parallel RF processing channels. The VGA is implemented in a two-stage, stacked configuration including two sets of cascode connected NPN transistor pairs.

The first stage defines a fine gain control that receives the RF input signal from the input transistor pair. The fine gain control includes a plurality of NPN transistor pairs connected in a cascode configuration. Each NPN transistor pair has a first NPN transistor and a second NPN transistor whose base electrodes receive a control signal. The control signal applied to the base electrode of the first NPN transistor of the pair is the inverse of the control signal applied to the second NPN transistor of the pair. In this way, only one of the NPN transistors in the pair is in a conducting state at a given time. The collector electrodes of the first transistors of the plurality of pairs is connected to the second stage, while the collector electrodes of the second NPN transistors of the plurality of pairs is connected to the voltage rail. By selectively applying the inverse control signals to the base electrodes of each pair, a portion of the RF input signal current is steered either to the second stage of the VGA, or alternatively, shunted to the voltage rail.

The second stage defines a coarse gain control which receives the steered RF current from the fine gain control. The coarse gain control comprises a plurality of NPN transistor pairs connected in a cascode configuration. Each NPN transistor pair has a first NPN transistor and a second NPN transistor whose base electrodes receive a control signal. The control signal applied to the base electrode of the first NPN transistor of the pair is the inverse of the control signal applied to the second NPN transistor of the pair. In this way, only one of the NPN transistors in the pair is in a conducting state at a given time. The collector electrodes of each first transistor of the plurality of pairs is connected to the VGA output terminal, while the collector electrodes of the second NPN transistors of the plurality of pairs are connected to the voltage rail. By selectively applying the inverse control signals to the base electrodes of each pair, a portion of the RF input signal current is steered either to the output terminal of the VGA, or alternatively, shunted to the voltage rail.

In order to implement NPN transistors in a small footprint, the semiconductor device is configured as a multiple layer semiconductor device having a plurality of NPN transistor pairs disposed on a lowermost layer. Each NPN transistor pair is bisected by a shared feed line which is also disposed in the uppermost layer. The base electrode of each NPN transistor in each NPN transistor pair is RF grounded via a metal-insulator-metal (MIM) capacitor. One MIM capacitor is shared by the two NPN transistors of each NPN transistor pair. The upper conductive plate of the MIM capacitors is configured to be a ground plane and the MIM capacitor is disposed on a layer below the uppermost layer, with the MIM capacitor located underneath the shared feed line. A first bias resistor is connected between a control circuit and the base electrode of the first NPN transistor of a given NPN transistor pair. A second bias resistor is connected between the control circuit and the base electrode of the second NPN transistor of the NPN transistor pair. The first and second bias resistors are disposed on layers below the layer containing the MIM capacitor such that the first and second bias resistors are located underneath the feed line. The layered configuration saves space and provides shielding of the low frequency control signals from the high frequency RF signal via the common ground plane.

DETAILED DESCRIPTION

Figure 1:
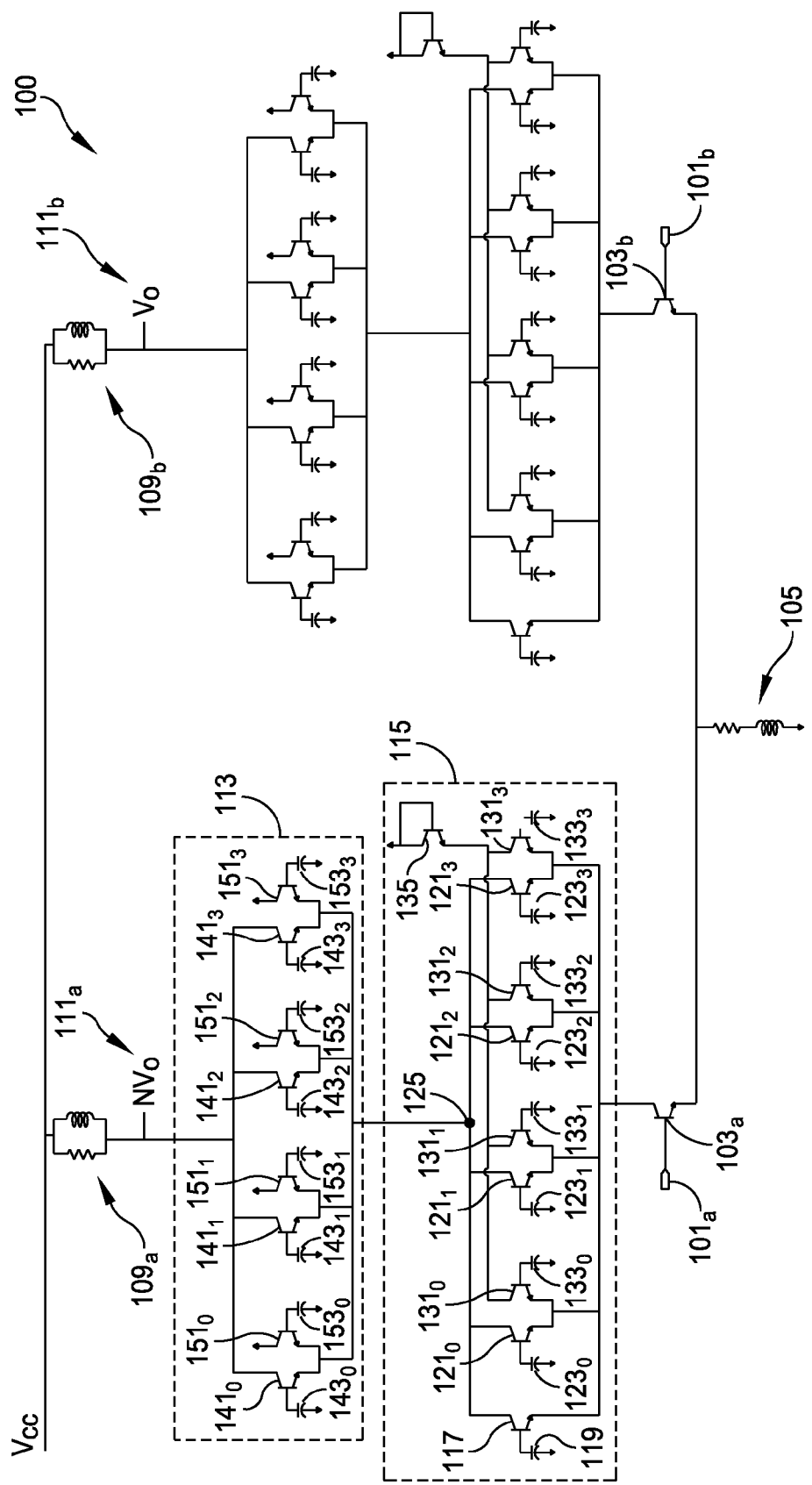
FIG. 1 is a schematic diagram of a digitally controlled wideband variable gain amplifier in accordance with an embodiment of the disclosure.

FIG. 1 is a schematic diagram of a VGA circuit 100 in accordance with an embodiment of the present disclosure. A differential input pair received at a first input node $101_a$, connected to the base of a first input transistor $103_a$. A second differential input node $101_b$, is connected to the base of a second input transistor $103_b$. The emitter of input transistor $103_a$ and the emitter of input transistor $103_b$ are connected to ground via an RL network 105 which provides common mode rejection as will be understood by one of skill in the art. The collector of input transistor $103_a$ is connected to a first output node $111_a$ through two sets of paired NPN transistors connected in a cascode configuration. The first set of cascode connected NPN transistor pairs provides a fine gain control circuit 115 (shown in more detail in FIG. 1A) for the VGA circuit 100. The second set of cascode connected NPN transistor pairs provides a coarse gain control circuit 113 (shown in more detail in FIG. 1B) for the VGA circuit 100. The first output node $111_a$ is connected to a voltage source 107 which provides a voltage to the circuit 100. The first output node $111_a$ is connected to the voltage source 107 via an RL network $109_a$ which acts as a matching network as known in the art.

The coarse gain control circuit 113 provides a larger gain step in decibels (dB) than the gain step provided by the fine gain control circuit 115. According to one embodiment of a VGA according to the disclosure, the coarse gain control circuit 113 provides a gain step of approximately 8 dB. The fine gain control circuit 115 provides control over a gain range smaller than the size of a single step of the course gain control circuit 113. In an exemplary embodiment, the fine gain control circuit 115 provides a linear control state wherein current is varied linearly to create steps over a range of about 7.5 dB of gain (vice the 8 dB gain step from the coarse gain control circuit 113). The fine gain linear control provides that each bit is twice the size of the next. Thus, fine gain control provides about 0.5 dB gain steps (over the 7.5 dB range), subject to some minor variations. That is, the gain for each fine gain control step is not precisely 0.5 dB, 1 dB, 1.5 dB, etc., whereas the coarse control gain step is 0 dB, 8 dB, 16 dB, 24 dB, and so on. Thus, a fine gain control circuit 115 operating with four bits of control over a range of about 7.5 dB will provide gain steps of about 0.5 dB subject to some small amount of error. The fine gain control circuit 115 thereby provides gain control within the step size or range of the larger gain steps provided by the coarse gain control circuit 113 output.

The second differential input node $101_b$ is connected to a second output node $111_b$ in an identical manner as the first input node $101_a$ with respect to first output node $111_a$. Therefore, the operation of the VGA circuit 100 is carried out in two parallel paths. A first path from first input node $101_a$ to first output node $111_a$, and a second path between second differential input node $101_b$ and second output node $111_b$. Because the operation of the two parallel paths are identical, only the details corresponding to the first path between first input node $101_a$ and first output node $111_a$ are described for the sake of clarity. It should be understood that the second parallel path between the second differential input node $101_b$ and the second output node $111_b$ will include the same components, operating in the same way as the description that follows relating to the first path between first input point $101_a$ and first output node $111_a$.

Figure 1A:
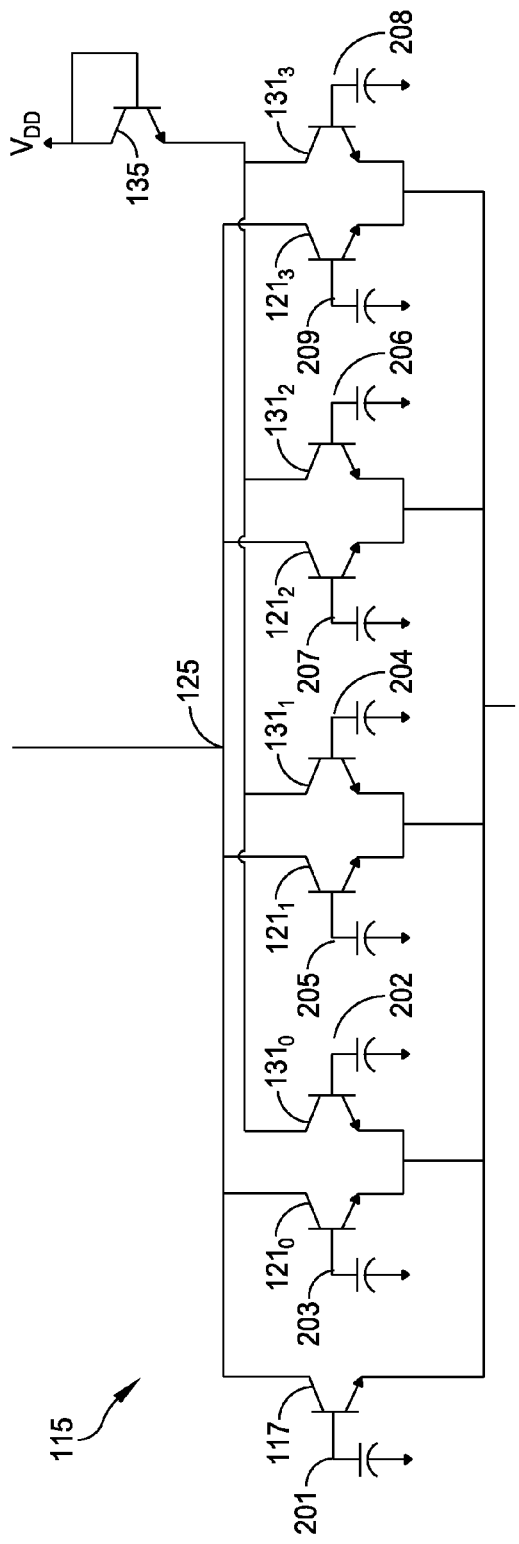
FIG. 1A is a more detailed schematic view of the fine gain control of the VGA circuit of FIG. 1.

The VGA circuit 100 comprises a stacked configuration including two groups of NPN transistors arranged in pairs and each group connected in a cascode configuration. The first group of NPN transistor pairs provides a coarse gain control circuit 113 for the VGA circuit 100. The second group of NPN transistor pairs provides fine gain control circuit 115 for the VGA circuit 100. The fine gain control circuit 115 includes a first NPN transistor 117. The emitter of the first NPN transistor 117 is connected to the collector of first input transistor $103_a$. Additionally, the collector of first input transistor $103_a$ is connected to the emitters of four NPN transistor pairs, each NPN transistor pair defined by two NPN transistors, denoted generally as 121 and 131. The emitters of each NPN transistor of each NPN transistor pair are commonly connected to the emitter of the first NPN transistor 117 and the collector of the first input transistor $103_a$. The first NPN transistor 117 and each NPN transistor 121, 131 of each NPN transistor pair includes a base electrode as shown in FIG. 1A which is configured to receive a bias voltage 201-209 which causes the NPN transistor 121, 131 to be in a conductive state or alternatively, in a non-conductive state. Each NPN transistor pair is further configured such that a bias voltage 201-209 applied to the first NPN transistor of the NPN transistor pair is the inverse of the bias voltage applied to the corresponding second NPN transistor of the NPN transistor pair. For example, referring to FIG. 1A, NPN transistor $121_0$ receives a bias voltage 203 at its base electrode. NPN transistor $131_0$ receives a bias voltage 202 at its base electrode which is the inverse of bias voltage 203. Assuming that bias voltage 203 is a high voltage state (such as $V_{DD}$) which causes NPN transistor $121_0$ to conduct, then bias voltage 202 is its inverse, or a low voltage state (such as $V_{SS}$), which causes NPN transistor $131_0$ not to conduct. Thus, only one NPN transistor of each NPN transistor pair conducts at any given time.

Referring again to FIG. 1, the collectors of NPN transistors 117 $121_0$, $121_1$, $121_2$ and $121_3$ are connected via node 125 to provide an input to the coarse gain control circuit 113. The complementary NPN transistors $131_0$, $131_1$, $131_2$ and $131_3$ of each NPN transistor pair have their collector electrodes diode connected (through transistor 135) to the voltage rail 107. Because each NPN transistor pair 121, 131 is configured to only have one of the NPN transistors in the pair conducting at any given time, each NPN transistor pair 121, 131 may be configured to steer current either to the coarse gain control circuit 113 (and ultimately the VGA output node $111_a$), or the current may be steered back to the voltage rail 107 through transistor 135. Transistor 135 provides a voltage drop which may be balanced with the voltage across the coarse gain control circuit 113. The NPN transistor pairs 121, 131 are controlled via the bias voltage 201-209 applied to the base of each NPN transistor. It should be noted that NPN transistor 117 does not have an associated transistor as part of a pair. Therefore, the bias 201 applied to the base of NPN transistor 117 is configured such that NPN transistor 117 is always conducting, thereby providing at least a baseline output signal from the fine gain control circuit 115 to node 125.

Each NPN transistor 117, 121, 131 has a base electrode that is connected to ground through a metal insulator metal (MIM) capacitor 123, 133. As will be explained hereinafter below, a metal ground plane may be used to form the upper plate of MIM capacitors 123, 133. The MIM capacitors 123, 133 may be integrated as part of the NPN transistors 121, 131. By treating the top capacitor plate as a ground plane, the circuit is simple to model and isolates the low frequencies of the bias control from the high frequencies of the RF channel. This is very important for modeling a circuit intended for operation at high frequencies, such as millimeter (mm) Wave frequencies.

Figure 1B:
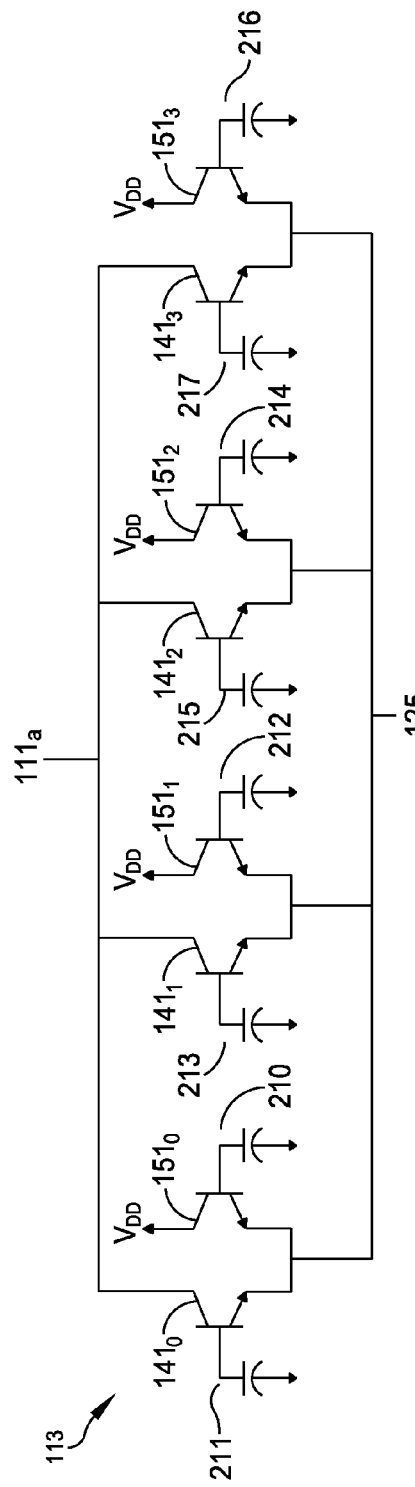
FIG. 1B is a more detailed schematic view of the coarse gain control of the VGA circuit of FIG. 1.

Current that is steered to the coarse gain control circuit 113 passes through node 125 and is received at the commonly connected emitters of NPN transistor pairs 141, 151 which define the coarse gain control circuit 113. Coarse gain control circuit 113 is positioned above the fine gain control circuit 115 so that the fine gain control circuit 115 always receives the full DC bias current. This is important because if the coarse gain control circuit 113 were placed below the fine gain control circuit 115, the fine gain control would become current starved and enter an undesirable operating condition when the coarse phase control was set to large attenuation states. The fine attenuation states do not decrease the DC bias current severely enough to affect the operation of the coarse gain control in the desired configuration. Coarse gain control circuit 113 is comprised of a number of NPN transistor pairs $141_0$, $151_0$, $141_1$, $151_1$, $141_2$, $151_2$ and $141_3$, $151_3$. The emitter of each transistor 141, 151 is commonly connected to node 125 and receives the output via node 125 from the fine gain control circuit 115. Each NPN transistor pair receives a bias voltage 210-217 at its base as shown in FIG. 1B. For each NPN transistor pair, the bias voltage applied to the base of the first NPN transistor of the NPN transistor pair is the inverse of the bias voltage applied to the base of the second NPN transistor's base in the NPN transistor pair. Accordingly, only one of the NPN transistors in the NPN transistor pair is configured to conduct current at any given time. The collector electrodes of NPN transistors $141_0$, $141_1$, $141_2$ and $141_3$ are commonly connected to VGA output node $111_a$ which is connected to the positive voltage rail 107 via RL network $109_a$. The collector electrodes of NPN transistors $151_0$, $151_1$, $151_2$ and $151_3$ are commonly connected to the voltage rail 107. The bias control of each NPN transistor pair 141, 151 may be controlled such that current through the coarse gain control circuit 113 at each NPN transistor pair is either steered to the VGA output node $111_a$ through NPN transistors $141_0$, $141_1$, $141_2$, $141_3$ or steered to the voltage rail 107 via NPN transistors $151_0$, $151_1$, $151_2$, $151_3$. The NPN transistors 141, 151 of the coarse gain control circuit 113 are configured in different sizes than the NPN transistors 121, 131 of the fine gain control circuit 115. In this way, the incremental gain steps output by the fine gain control circuit 115, serve to fine tune each gain step of the coarse gain control circuit 113. The result achieved by the stacked cascode configuration of VGA circuit 100 using a first set of cascode connected NPN transistor pairs to define a coarse gain control circuit 113 in combination with a second set of cascode connected NPN transistors to form a fine gain control circuit 115 is a wideband VGA 100 which operates at high frequencies with superior gain range, gain control (e.g. resolution) and phase variation characteristics.

Figure 2:
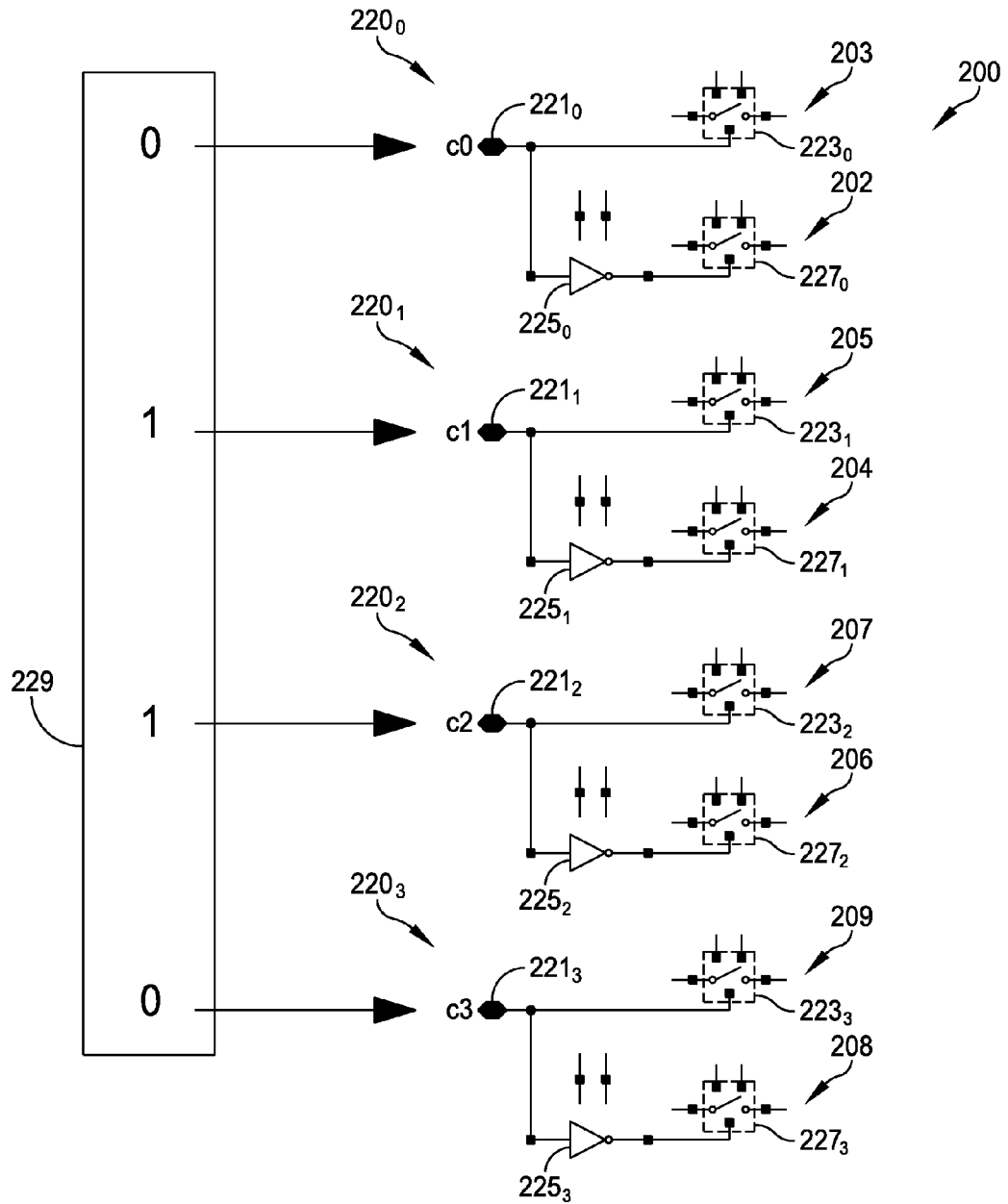
FIG. 2 is a schematic view of a control circuit for providing digital control for the VGA circuit shown in FIG. 1.

FIG. 2 is a circuit diagram showing a control circuit 200 for providing a bias voltage to the base of each NPN transistor in each NPN transistor pair in either coarse gain control circuit 113, or fine gain control circuit 115 of VGA circuit 100 shown in FIG. 1. Control circuit 200 provides control signals to the base electrodes of the NPN transistor pairs 121/131 and 141/151 illustrated in FIGS. 1, 1A and 1B. As shown in FIG. 2, each control circuit 220 includes a node $221_0$, $221_1$, $221_2$, $221_3$ for receiving a bit of a control word 229. For example, node $221_0$ of control circuit $220_0$ may be configured to receive the least significant bit of a four bit control word 229. Node $134_1$ of control circuit $221_1$ may be configured to receive the second least significant bit of a four bit control word 229, and so on.

The control circuits 220 shown in FIG. 2 are used to control the bias voltage at the base electrode of each NPN transistor for each NPN transistor pair making up fine gain control circuit 115. This illustration is provided by way of example only, and other control circuits may be contemplated by one of skill in the art which could control the bias of each NPN transistor pair which would still fall within the scope and spirit of this disclosure. Each control circuit 220 includes a pair of switches 223, 227 where switch 223 is directly connected to node 221 and switch 227 is connected to node 221 through an inverter 225. The second end of switch 223 is coupled to the base electrode of NPN transistors 203, 205, 207, 209 of fine gain control circuit 115 The conductivity of the NPN transistor 203, 205, 207, 209 is controlled by the control bit received at node 221. The second end of switch 227 is coupled to the base electrode of NPN transistors 202, 204, 206, 208 and provides the inverse of the bit value output by the second end of switch 223. The inverse of the bit applied to node 221 is output from the second end of switch 227 and applied to the base of corresponding transistor 202, 204, 206, 208. The conductivity of transistors 202, 204, 206, 208 is controlled by the inverse of the control bit received at node 221. Because switch 223 and switch 227 output inverse bias signals with respect to each other, and the outputs of switch 223 and switch 227 provide bias voltage to the base electrode of each NPN transistor in a corresponding NPN transistor pair, only one NPN transistor in each NPN transistor pair will conduct at any given time.

The operation of VGA circuit 100 will now be described with reference to FIGS. 1 and 2. An RF signal is received at differential input nodes $101_a$ and $101_b$ which are coupled to the base electrodes of input transistors $103_a$ and $103_b$ illustrated in FIG. 1. A multi-bit control word 229 is received by control circuits $220_0$, $220_1$, $220_2$, $220_3$ as shown in FIG. 2. For the purposes of this example, the multi-bit control word 229 is "0110". As shown in FIG. 2, the control circuits 220 control the NPN transistor pairs of fine gain control circuit 115. The least significant bit of the multi-bit control word 229 is a '0' (i.e. a low voltage state such as $V_{SS}$) which is received at node $221_0$ of control circuit $220_0$. The second least significant bit, '1', is received at node $221_1$ of control circuit $220_1$. The second most significant bit, '1', is received at node $221_2$ of control circuit $220_2$. The most significant bit, '0', is received at node $221_3$ of control circuit $220_3$. At node $221_0$, the '0' bit received is output via switch $223_0$ to the base of NPN transistor $121_0$ at node 203. The low voltage state of the '0' bit at node 203 places NPN transistor $121_0$ in a non-conducting state. Meanwhile, the '0' bit received at node $221_0$ passes through inverter $225_0$ and outputs a '1' to switch $227_0$ which is applied to the base of NPN transistor $131_0$ at node 202. The '1' received at the base of NPN transistor $131_0$ causes NPN transistor $131_0$ to be placed in a conductive state. The NPN transistor pair defined by NPN transistor $121_0$ and NPN transistor $131_0$, therefore, has only one NPN transistor in the pair (NPN transistor $131_0$ in this example) conducting at any given time. NPN transistor $131_0$ is placed in a conductive state by a high bias voltage state, represented by control bit 1 received from switch $227_0$, and conducts current from RF input 101, through NPN transistor $131_0$ to the voltage rail $V_{DD}$ 107 via transistor 135.

Referring again to FIG. 2, the second least significant bit, '1', is received at node $221_1$. The '1' bit is passed via switch $223_1$ to the base of NPN transistor $121_1$ at node 205. The high bias voltage state represented by the '1' control bit, causes NPN transistor $121_1$ to enter a conductive state. Meanwhile, the '1' control bit received at node $221_1$ passes through inverter $225_1$ where it is changed to a '0' low voltage state. The low voltage state is applied via switch $227_1$ to the base of NPN transistor $131_1$, which along with NPN transistor $121_1$ forms a NPN transistor pair. The low bias voltage state at the base of NPN transistor $131_1$ places NPN transistor $131_1$ in a non-conducting state. Thus, only one of NPN transistor $121_1$ and NPN transistor $131_1$ in the NPN transistor pair is conducting at any given time. The control bit '1' applied to the base of NPN transistor $121_1$ causes NPN transistor $121_1$ to conduct and allows current from the RF input 101 to pass through NPN transistor $121_1$ to the first output node $111_a$.

The second most significant bit, '1', is received at node $221_2$. The '1' bit is passed via switch $223_2$ to the base of NPN transistor $121_2$ at node 207. The high bias voltage state represented by the '1' control bit, causes NPN transistor $121_2$ to enter a conductive state. Meanwhile, the '1' control bit received at node $221_2$ passes through inverter $225_2$ where it is changed to a '0' low voltage state. The low voltage state is applied via switch $227_2$ to the base of NPN transistor $131_2$, which along with NPN transistor $121_2$ forms a NPN transistor pair. The low bias voltage state at the base of NPN transistor $131_2$ places NPN transistor $131_2$ in a non-conducting state. Thus, only one of NPN transistor $121_2$ and NPN transistor $131_2$ in the NPN transistor pair is conducting at any given time. The control bit '1' applied to the base of NPN transistor $121_2$ causes NPN transistor $121_2$ to conduct and allows current from RF input 101 to pass through NPN transistor $121_2$ to the first output node $111_a$.

Finally, the most significant bit '0', is received at node $221_3$ of control circuit $220_3$. The '0' bit passes through switch $223_3$ and is applied to the base of NPN transistor $121_3$ at node 209. Meanwhile, control bit '0' is applied to inverter $225_3$ and converted to a high voltage state represented as a '1' bit. The inverted '1' bit is applied via switch $227_3$ to the base of NPN transistor $131_3$ at node 208. NPN transistor $121_3$ and NPN transistor $131_3$ define a NPN transistor pair. Since NPN transistor $121_3$ receives a low bias voltage state, as represented by the control bit '0', NPN transistor $121_3$ is placed in a non-conducting state. NPN transistor $131_3$ receives the inverted high bias voltage represented as the control bit '1' which causes NPN transistor $131_3$ to be placed in a conducting state. Thus, only one of NPN transistor $121_3$ and NPN transistor $131_3$ is conducting at any give time. The high bias voltage applied to NPN transistor $131_3$ causes NPN transistor $131_3$ to conduct which steers current from the RF input 101, through transistor $131_3$ to the voltage rail, $V_{DD}$ 107 via transistor 135.

Referring now to FIG. 1, the multi-bit control word '0110' applied to the fine gain control circuit 115, causes NPN transistor $121_1$ and NPN transistor $121_2$ to conduct, thereby steering current from the RF input 101 to the output of fine gain control circuit 115 at node 125. The inverted control bits, provided by inverters $225_0$, $225_1$, $225_2$, $225_3$ cause transistors $131_0$ and $131_3$ to conduct and steer current from the RF input 101 to the voltage rail $V_{DD}$ 107. As may be seen, the combination of NPN transistors $121_0$, $121_1$, $121_2$, $121_3$ which steer current to the output node 125 may be controlled by the sequence of control bits input to control circuits $220_0$, $220_1$, $220_2$, $220_3$. By selecting which NPN transistors 121 steer current toward the output of the VGA and which NPN transistors 131 steer current to the voltage rail 107, the gain of the VGA circuit 100 may be controlled. The VGA circuit 100 shown in FIG. 1 utilizes two gain control circuits 113, 115 stacked in a single VGA stage to provide gain control with greater gain control resolution than VGA's having only one level of current steerage or amplifiers implementing multiple staged VGA circuits.

According to one embodiment of the disclosure, the VGA 100 is controlled by a six (6) bit control word. The four least significant bits provide control to fine gain control circuit 115 sequentially to each NPN transistor pair as described hereinabove with respect to FIG. 2. Thus, a minimum gain would cause all current to be steered to the voltage rail 107 except for the current directed though NPN transistor 117 shown in FIG. 1 which is configured to always in an "on" state. The two most significant bits are decoded such that they turn on or off the four NPN transistor pairs 141, 151 in the coarse gain control circuit 113. With reference to coarse gain control circuit 113 shown in FIG. 1B, a two bit control word provides four possible bit combinations, 00, 01, 10 and 11. Coarse gain control circuit 113 may be configured such that NPN transistor $141_3$ is always on and NPN transistor $151_3$ is always off. For a minimum gain or state (e.g. control bits 11), the NPN transistors in coarse gain control circuit 113 that are set to on (i.e. conducting) are $141_3$, $151_2$, $151_1$ and $151_0$. The next gain step (control bits 10), is configured to turn on NPN transistors $141_3$, $141_2$, $151_1$ and $151_0$. For control bits 01, coarse gain control is configured to turn on NPN transistors $141_3$, $141_2$, $141_1$ and $151_0$. Finally, for control bits 00, NPN transistors $141_3$, $141_2$, $141_1$ and $141_0$ are set to on and are all conducting.

According to an embodiment, the transistors used in the VGA circuit 100 shown in FIG. 1 are NPN transistors. For example, the VGA circuit 100 may be used using heterojunction bipolar transistors (HBTs). While MOSFETs are smaller devices which are easily controlled and configured, HBTs provide better performance in many aspects including, gain, higher transition frequency (Ft), better input/output matching and the like. The use of NPN transistors allows the VGA to have less variation in step size over frequency at mmWave frequencies due to its higher Ft, and exhibits a much flatter gain for the same reason. This allows for increased flexibility when designing the RF chain. Because of the increased size of NPN transistors, combined with the additional size requirements created by the MIM capacitors associated with each NPN transistor, keeping the VGA design within specified space restraints becomes problematic. The use of HBTs along with a novel layout of the circuit design allows for the realization of VGA circuit 100 with improved performance characteristics, particularly at very high frequencies. This is realized in a compact layout design which does not cause an unacceptable increase in the circuit footprint. In an embodiment of the VGA circuit 100 shown in FIG. 1, the circuit footprint is in the micrometer (μm) range. According to an embodiment depicted in FIG. 4, a circuit footprint with dimensions of 350 μm×450 μm may be realized.

Figure 3:
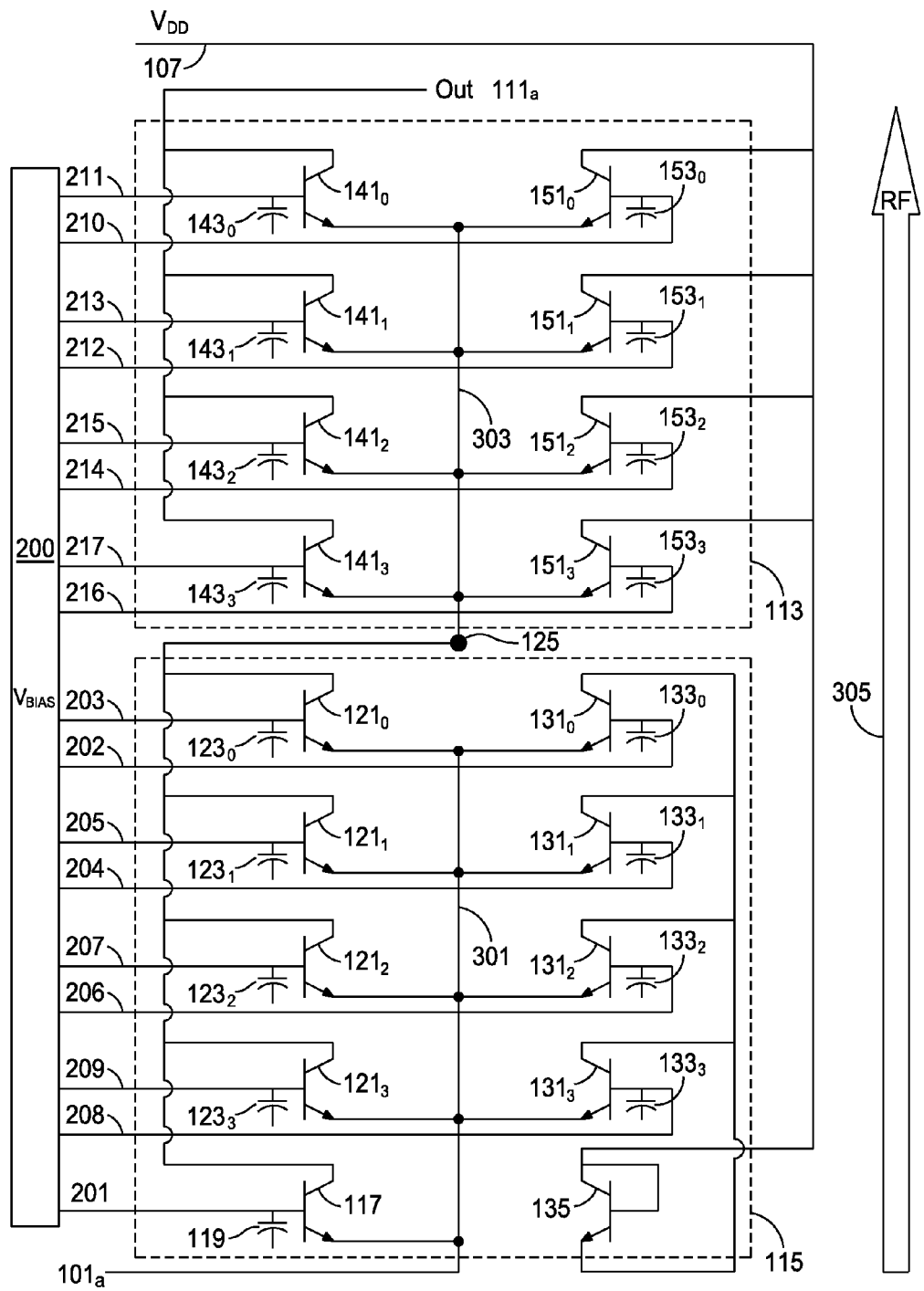
FIG. 3 is a schematic view of the control circuit, and fine and coarse gain control, showing the relative positioning of certain circuit components according to an embodiment of the disclosure.

FIG. 3 is a schematic view of a portion of the VGA circuit 100 shown in FIG. 1 showing the physical layout of components according to an embodiment of the disclosure. An RF input is received at input node 101, which is received from the collector electrode of the first input transistor ($103_a$, FIG. 1). The RF input signal is transmitted to the fine gain control circuit 115. Fine gain control circuit 115 includes a plurality of NPN transistor pairs, comprising two NPN transistor denoted generally as 121 and 131. A control circuit 200 provides a bias voltage ($V_{bias}$) which is applied to the base electrode of each NPN transistor of each NPN transistor pair 121, 131. Within each NPN transistor pair, control circuit 200 provides a bias voltage to the first NPN transistor in the NPN transistor pair, that is the inverse of the bias voltage applied to the second NPN transistor in the NPN transistor pair. In this way, only one NPN transistor of each NPN transistor pair is in a conductive state at any given time. NPN transistors $121_0$, $121_1$, $121_2$, $121_3$ receive the RF input signal at their collector electrodes via feed line 301. The collector electrode of NPN transistors $121_0$, $121_1$, $121_2$, $121_3$ are connected to output node 125 which provides the output signal from fine gain control circuit 115 to the coarse gain control circuit 113. NPN transistor 117 is connected in a like manner as NPN transistors $121_0$, $121_1$, $121_2$, $121_3$ but does not have a corresponding NPN transistor to form a NPN transistor pair. Bias voltage 201 from control circuit 200 is applied to the base electrode of NPN transistor 117 such that NPN transistor 117 is always conducting, thereby providing an output signal to node 125 even if NPN transistors $121_0$, $121_1$, $121_2$, $121_3$ are all in a non-conducting state as specified by bias voltage signals 203, 205, 207, 209.

NPN transistors $131_0$, $131_1$, $131_2$, $131_3$ are connected at their emitter electrodes to feed line 301. The collector electrodes of NPN transistors $131_0$, $131_1$, $131_2$, $131_3$ are connected to the voltage rail 107 via matching NPN transistor 135. Feed line 301 is placed between NPN transistors $121_0$, $121_1$, $121_2$, $121_3$ and NPN transistors $131_0$, $131_1$, $131_2$, $131_3$ and is commonly connected to each emitter electrode of each NPN transistor in the fine gain control circuit 115 defining a compact circuit layout.

Node 125 receives the output signal from fine gain control circuit 115. Current flowing through selected NPN transistors $121_0$, $121_1$, $121_2$, $121_3$ and NPN transistor 117 is passed via node 125 as input to coarse gain control circuit 113. Coarse gain control circuit 113 includes a plurality of NPN transistor pairs, each NPN transistor pair contains two transistors denoted generally as 141 and 151. A control circuit 200 provides a bias voltage ($V_{bias}$) which is applied to the base electrode of each NPN transistor of each NPN transistor pair 141, 151. Within each NPN transistor pair, control circuit 200 provides a bias voltage to the first NPN transistor in the NPN transistor pair that is the inverse of the bias voltage applied to the second NPN transistor in the NPN transistor pair. In this way, only one NPN transistor of each NPN transistor pair is in a conductive state at any given time. NPN transistors $141_0$, $141_1$, $141_2$, $141_3$ receive the output signal from fine gain control circuit 115 at their collector electrodes via feed line 303. The collector electrode of NPN transistors $141_0$, $141_1$, $141_2$, $141_3$ are connected to output node $111_a$.

NPN transistors $151_0$, $151_1$, $151_2$, $151_3$ are connected at their emitter electrodes to feed line 303. The collector electrodes of NPN transistors $151_0$, $151_1$, $151_2$, $151_3$ are connected to the voltage rail 107 in parallel with matching NPN transistor 135. Feed line 303 is placed between NPN transistors $141_0$, $141_1$, $141_2$, $141_3$ and NPN transistors $151_0$, $151_1$, $151_2$, $151_3$ and is commonly connected to each emitter electrode of each NPN transistor in the coarse gain control circuit 113 defining a compact circuit layout.

Referring again to FIG. 1, the portion of VGA circuit 100 depicted in FIG. 3 corresponds to the left branch that receives input via input transistor $103_a$. As will be recognized by one of skill in the art, a right branch that receives its input from second differential input node $101_b$ via second input transistor $103_b$ will operate in a similar manner to provide output to output node $111_b$. Feed lines 301, 303 are positioned centrally between the NPN transistors 121, 131, 141, 151 of each NPN transistor pair defining fine gain control circuit 115 and coarse gain control circuit 113. This allows for compact placement of the NPN transistors. In addition, control circuit 200 is placed outside of the right and left branches shown in FIG. 1 as input nodes $101_a$ and $101_b$, respectively. By placing the control circuit 200 outside of the RF channel 305 (shown in FIG. 3), isolation is provided between the high frequency signal in the RF channel and the low frequency control signals 201-217. The stacking of two sets of cascode connected NPN transistor pairs, provides a VGA with improved gain step resolution without degradation in bandwidth, phase control, and compression of the RF signal.

Figure 4:
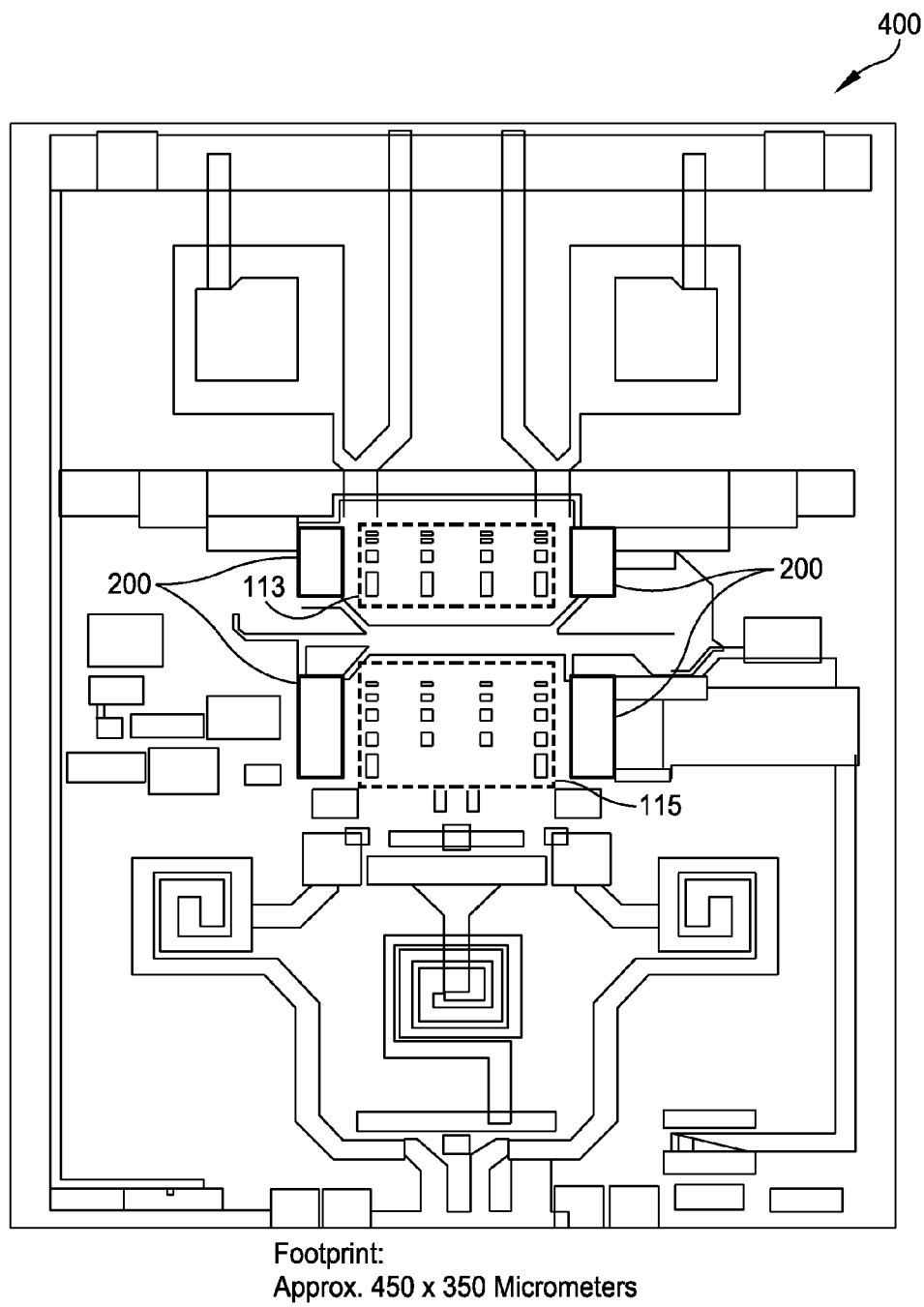
FIG. 4 is a plan view of a digitally controlled VGA according to an embodiment of the disclosure.

FIG. 4 shows a plan view of a digitally controlled wideband VGA 400 according to an embodiment of the disclosure. VGA 400 includes control circuits 200 which are placed along the outside edges of coarse gain control circuit 113 and fine gain control circuit 115. The control circuits 200 generate digital control signals which are applied to the bases of NPN transistors which define the coarse gain control circuit 113 and the fine gain control circuit 115. Placing the control circuits 200 outside of the fine and coarse gain control circuits 115, 113 helps isolate low frequency control signals created by the control circuits 200 from the high frequency RF signals that are processed through the RF channel defined by coarse gain control circuit 113 and fine gain control circuit 115. The novel layout of the VGA circuit 400 using stacked fine and coarse gain control circuits configured as described hereinabove with regard to FIG. 3 and as further described below with regard to FIG. 7, allows for a schematic layout which is compact. The compact design allows for the use of NPN transistors to leverage their advantages over comparable MOSFET transistors and to achieve a circuit footprint with dimensions in the micrometer range. By way of non-limiting example, the VGA circuit 400 of FIG. 4 is achieved in a circuit footprint of about 450 µm×350 µm.

In the VGA 400 shown in FIG. 4, the differential input signal at input nodes $101_a$, $101_b$ (shown in FIG. 1) is received upstream of the fine gain control circuit 115 and is provided to the fine gain control circuit 115 for amplifying the RF input signal before reaching the coarse gain control circuit 113. The fine gain control circuit 115 is configured to include NPN transistor pairs 121,131 (shown in FIG. 1) which are sized such that when the fine gain control circuit 115 is at its lowest gain step, sufficient current remains to feed the coarse gain control circuit 113. Due to the sizing of the NPN transistors making up the NPN transistor pairs in the coarse gain control circuit 113, if the coarse gain control circuit 113 received the RF input received at input node 101 before reaching the fine gain control circuit 115, only a tiny amount of current would pass through the coarse gain control circuit 113. This small current is insufficient to feed the fine gain control circuit 115 which would become current starved and degrade the performance of VGA 400.

Figure 5:
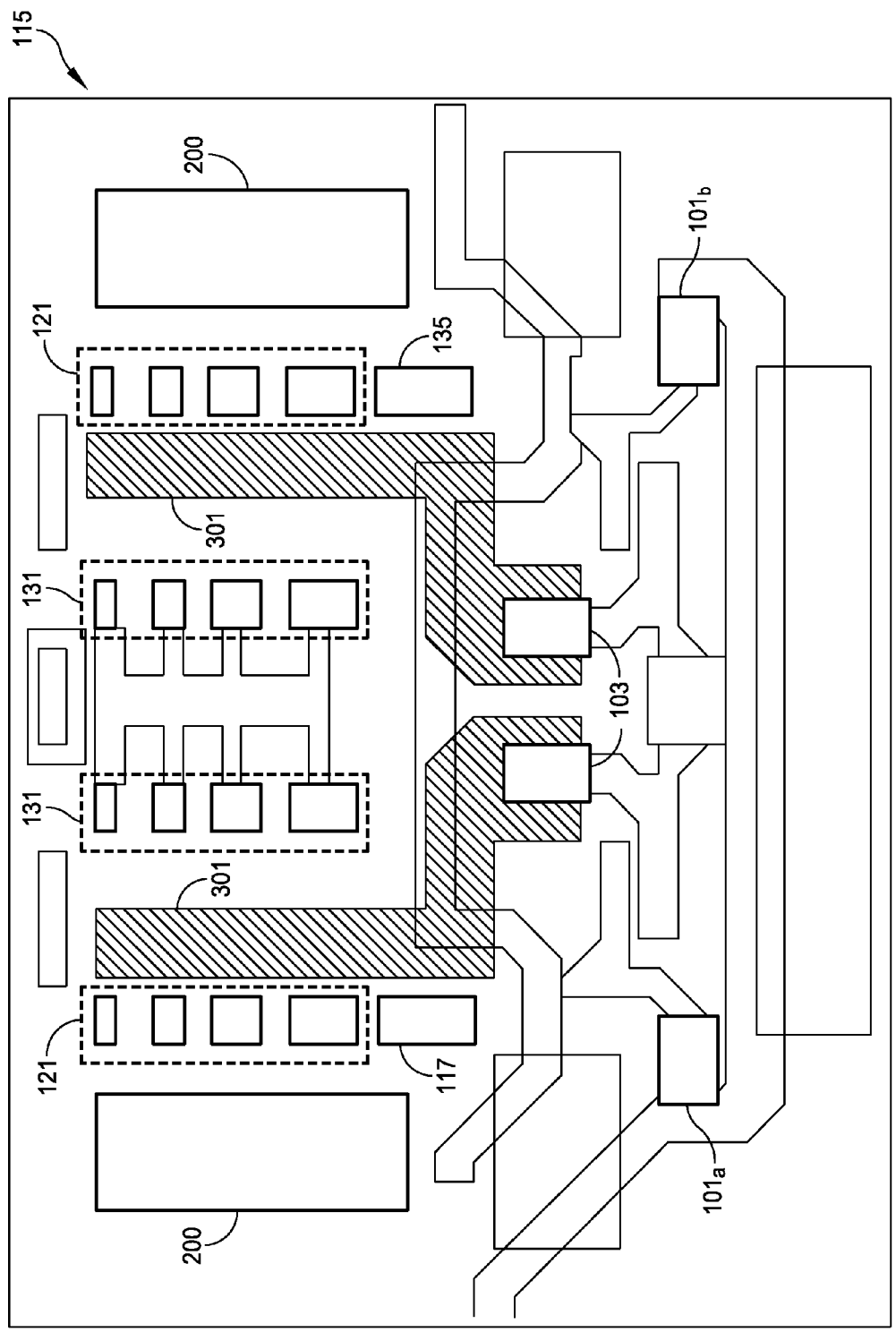
FIG. 5 is a more detailed plan view of the VGA shown in FIG. 4 showing the fine gain control.

FIG. 5 is a plan view of the VGA 400 shown in FIG. 4 showing the fine gain control circuit 115 in more detail according to an embodiment of the disclosure. A differential RF signal is received via input nodes $101_a$, $101_b$. The RF signal is applied to the base electrodes of two input transistors $103_a$, $103_b$ coupled to input nodes $101_a$, $101_b$. Current generated from the RF input signal at input node 101 is transmitted along feed line 301, which feeds the RF input signal to the collector electrodes of NPN transistor pairs 121, 131 along with NPN transistor 117 and matching NPN transistor 135. Control of the fine gain control circuit 115 is provided through control signals generated by control circuits 200. The control circuits 200 provide control signals to the base electrodes of NPN transistors 121, 131, 117 and 135. By selectively turning NPN transistors 121, 131 on or off, current may be steered to the coarse gain control circuit 113 (shown in FIG. 4). NPN transistors 121 are each paired with a corresponding NPN transistor 131 to form a NPN transistor pair. The collector electrode of NPN transistor 121 in the NPN transistor pair is connected to the input of the coarse gain control, while the collector electrode of the transistor 131 in the NPN transistor pair is diode connected to the voltage rail $V_{DD}$. Control circuit 200 is configured to provide a control signal to a first NPN transistor of each transistor pair which is the inverse of the control signal supplied to the corresponding second NPN transistor of the NPN transistor pair. Because the control signals applied to the base electrodes of the NPN transistor pair are inverses, only one of the NPN transistors 121, 131 in the NPN transistor pair is turned on at any give time. This allows digital control of the fine gain control circuit 115 by selectively steering current through either NPN transistor 121 to the next gain control level, or through NPN transistor 131 to the voltage rail. The feed line 301 is placed between the NPN transistors of each NPN transistor pair to provide a compact design which further isolates the high frequency RF channel from the low frequency control signals of control circuits 200. Control circuits 200 are placed to the outer sides of the NPN transistors 121, 131, 117, 135.

Figure 6:
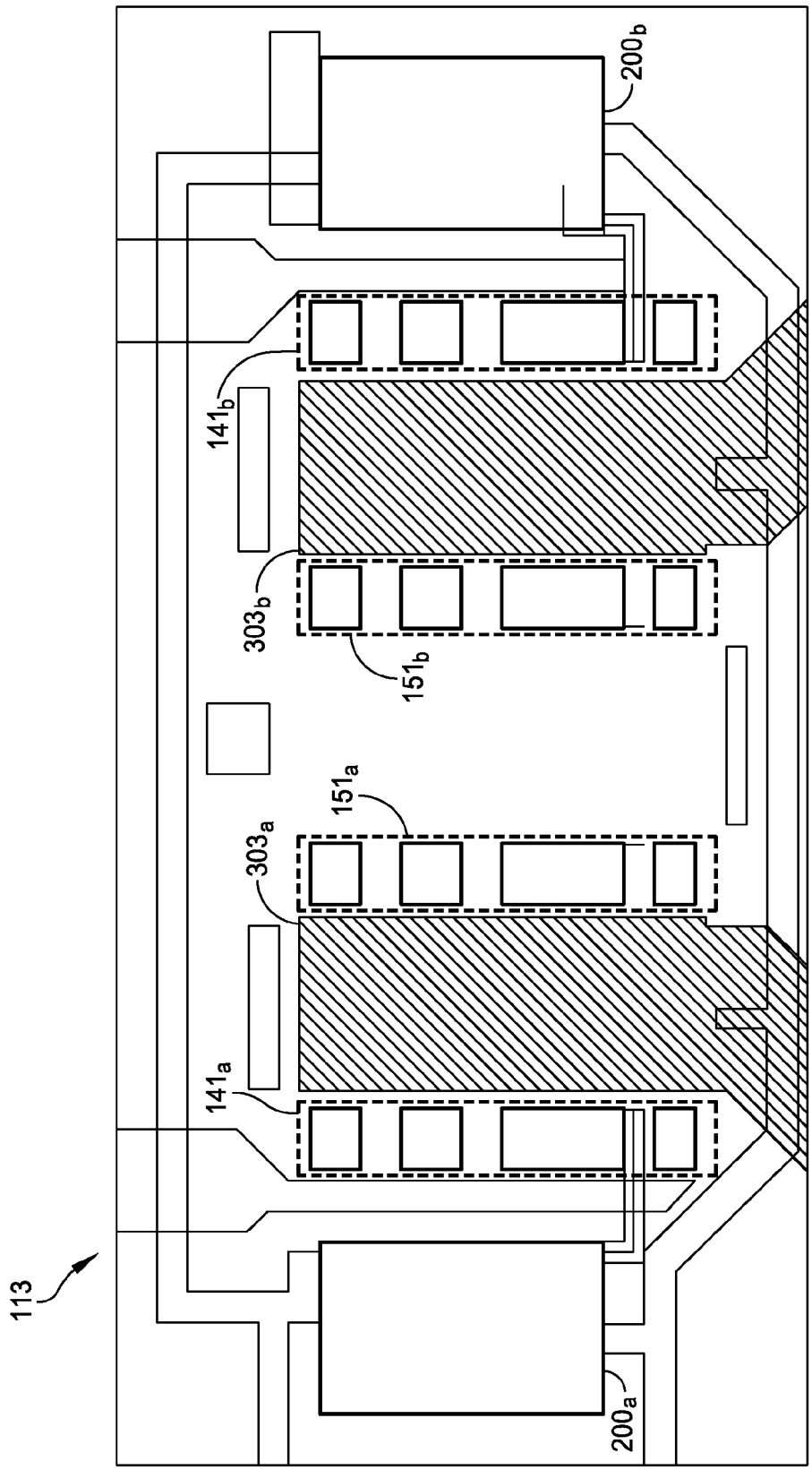
FIG. 6 is a more detailed plan view of the VGA shown in FIG. 4 showing the coarse gain control.

FIG. 6 is a plan view of the VGA 400 shown in FIG. 4 showing coarse gain control circuit 113 in greater detail according to an embodiment of the disclosure. An RF input signal received at input node 101 (shown in FIG. 5) is transmitted along feed lines $303_a$, $303_b$. Feed lines $303_a$ and $303_b$ are placed between rows of NPN transistors 141, 151. Each NPN transistor 141 is associated with a corresponding NPN transistor 151 to form a NPN transistor pair. Feed line 303 transmits the output of fine gain control circuit 115 and supplies the output to the emitter electrodes of each NPN transistor pair 141, 151. Control circuits 220 generate digital control signals which are applied to the base electrodes of transistors 141, 151. The collector electrode of NPN transistor 141 in the NPN transistor pair is connected to the output node 111 of VGA 400, while the collector electrode of the transistor 151 in the NPN transistor pair is connected to the voltage rail $V_{DD}$. Control circuit 200 is configured to provide a control signal to a first NPN transistor of each transistor pair which is the inverse of the control signal supplied to the corresponding second NPN transistor of the NPN transistor pair. Because the control signals applied to the base electrodes of each NPN transistor in the NPN transistor pair are inverses of each other, only one of the NPN transistors 141, 151 in the NPN transistor pair is turned on at any give time. This allows for digital control of the coarse gain control circuit 113 by selectively steering current through either NPN transistor 141 to the VGA output node 111 (shown in FIG. 1), or through NPN transistor 151 to the voltage rail. The feed line 303 is placed between the NPN transistors of each NPN transistor pair to provide a compact design which further isolates the high frequency RF channel from the low frequency control signals of control circuits 200 which are placed to the outer sides of the NPN transistors 141, 151.

Figure 7:
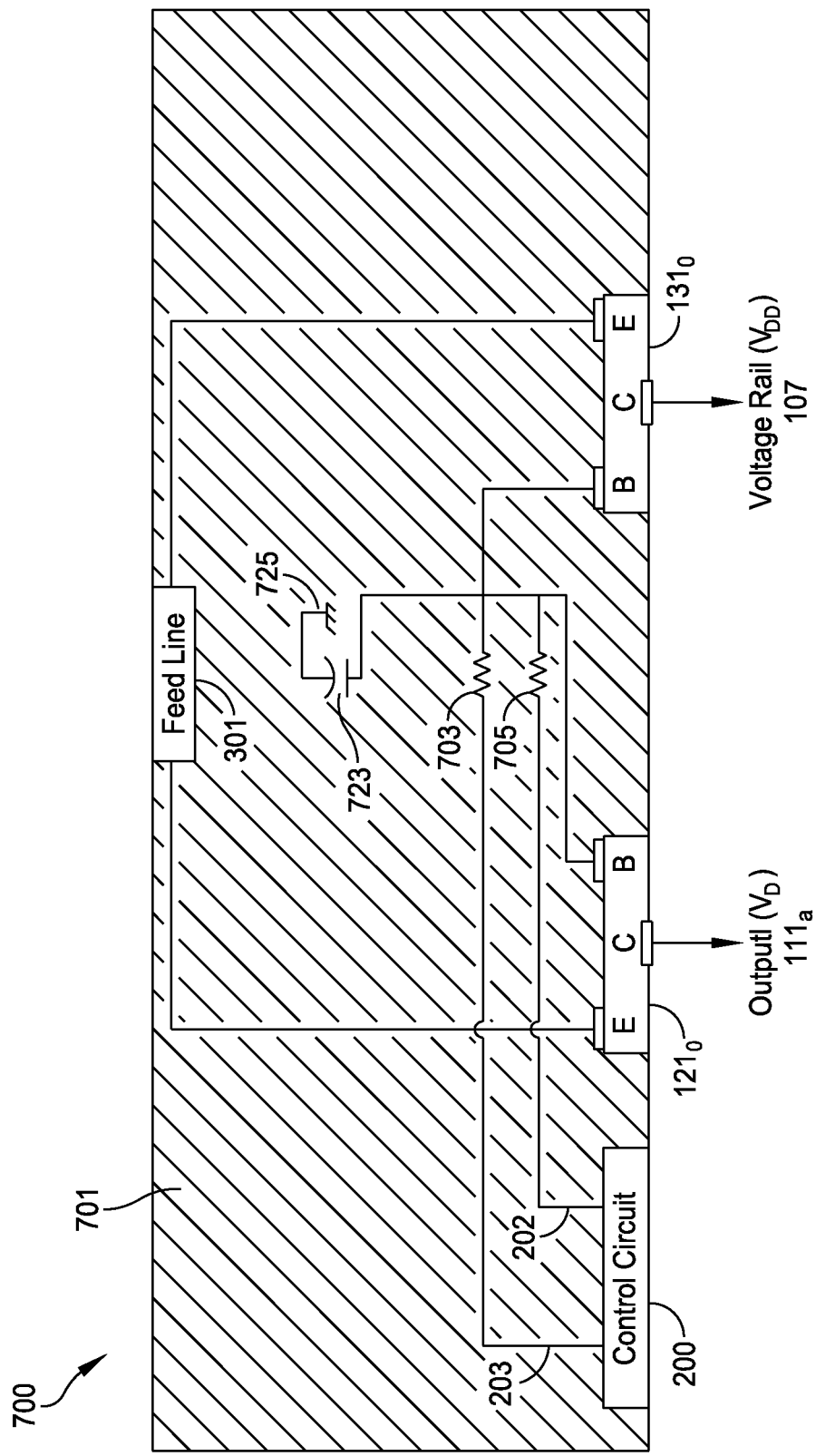
FIG. 7 is a cross section view showing the relative positioning of certain components of a digitally controlled VGA according to an embodiment of the disclosure.

FIG. 7 is a cross-sectional view of a VGA 700 showing the relative positions of certain components according to an embodiment of this disclosure. VGA 700 includes a pair of NPN transistors $121_0$, $131_0$ which are positioned on a lowermost surface of a substrate 701. NPN transistor $121_0$ and NPN transistor $131_0$ are positioned opposite one another with feed line 301 disposed on an uppermost layer of substrate 701 and located intermediate the two NPN transistors $121_0$, $131_0$.

Feed line 301 is electrically connected to the emitter electrode of NPN transistor $121_0$ and the emitter electrode of NPN transistor $131_0$. Accordingly, the emitters of NPN transistors $121_0$, $131_0$ are commonly connected via feed line 301. Feed line 301 carries at least a portion of the current produced by the input signal received at the input nodes (shown as 101 in FIG. 1).

The collector electrode of NPN transistor $121_0$ is electrically connected to the positive output node $111_a$ of the VGA. The collector electrode of NPN transistor $131_0$ is electrically connected to the voltage rail $V_{DD}$ 107. The NPN transistor pair $121_0$, $131_0$ is configured such that at any given time, only one of NPN transistors in the pair is in a conductive state. When the NPN transistor is in a conductive state, the current steered through the NPN transistor $121_0$, $131_0$ via the feed line 301 is either directed to the positive output node $111_a$ when NPN transistor $121_0$ is conducting, or to the voltage rail $V_{CC}$ when NPN transistor $131_0$ is conducting.

The states of NPN transistors $121_0$, $131_0$ are controlled through a control signal applied to the base electrode of each NPN transistor $121_0$, $131_0$. The control signal is generated by control circuit 200 which outputs the control signal through a bias resistor 703, 705 to the base electrode of the NPN transistor $121_0$, $131_0$. Each base electrode is further connected to ground 725 via a shared metal-insulator-metal (MIM) capacitor 723. The MIM capacitor 723 is shared between the base electrode of NPN transistor $121_0$ and the base electrode of NPN transistor $131_0$.

As may be seen in FIG. 7, the components are arranged in layers within the substrate 701. Feed line 301 is disposed on the uppermost layer of substrate 701. Below the feed line 301, there is disposed a ground layer represented schematically as 725. The ground layer 725 may be used to form the top plate of MIM capacitor 723 which is shared between the base electrodes of NPN transistor $121_0$ and NPN transistor $131_0$. The ground plane 725 serves to shield the RF channel flowing through feed line 301 from the control circuit components, such as control circuit 200, NPN transistors $121_0$, $131_0$, and bias resistors 703, 705. Beneath the feed line 301 and MIM capacitor 723, the bias resistors 703, 705 connected between the control circuit 200 and the base electrodes of NPN transistors $121_0$, $131_0$ are disposed on lower layers within substrate 701. Control circuit 200 and NPN transistors $121_0$ and $131_0$ are positioned on a lowermost layer of substrate 701. This configuration, which shares feed line 301 and capacitor 723 between NPN transistor $121_0$ and NPN transistor $131_0$ and positions the MIM capacitor 723 and bias resistors 703, 705 directly below the feed line 301, allows for a compact footprint which in turn, allows for the use of NPN transistors instead of MOSFET's, providing the additional benefits provided by NPN transistors, for example, a higher $F_t$. In addition, positioning the bias resistors 703, 705 and MIM capacitor 723 having the ground plane 725 as an upper plate directly underneath feed line 301 provides RF shielding which isolates the control circuitry 200 from the RF channel. Thus, gain attenuation due to leakage from the high-frequency operation of the VGA 700 is minimized.

Figure 8:
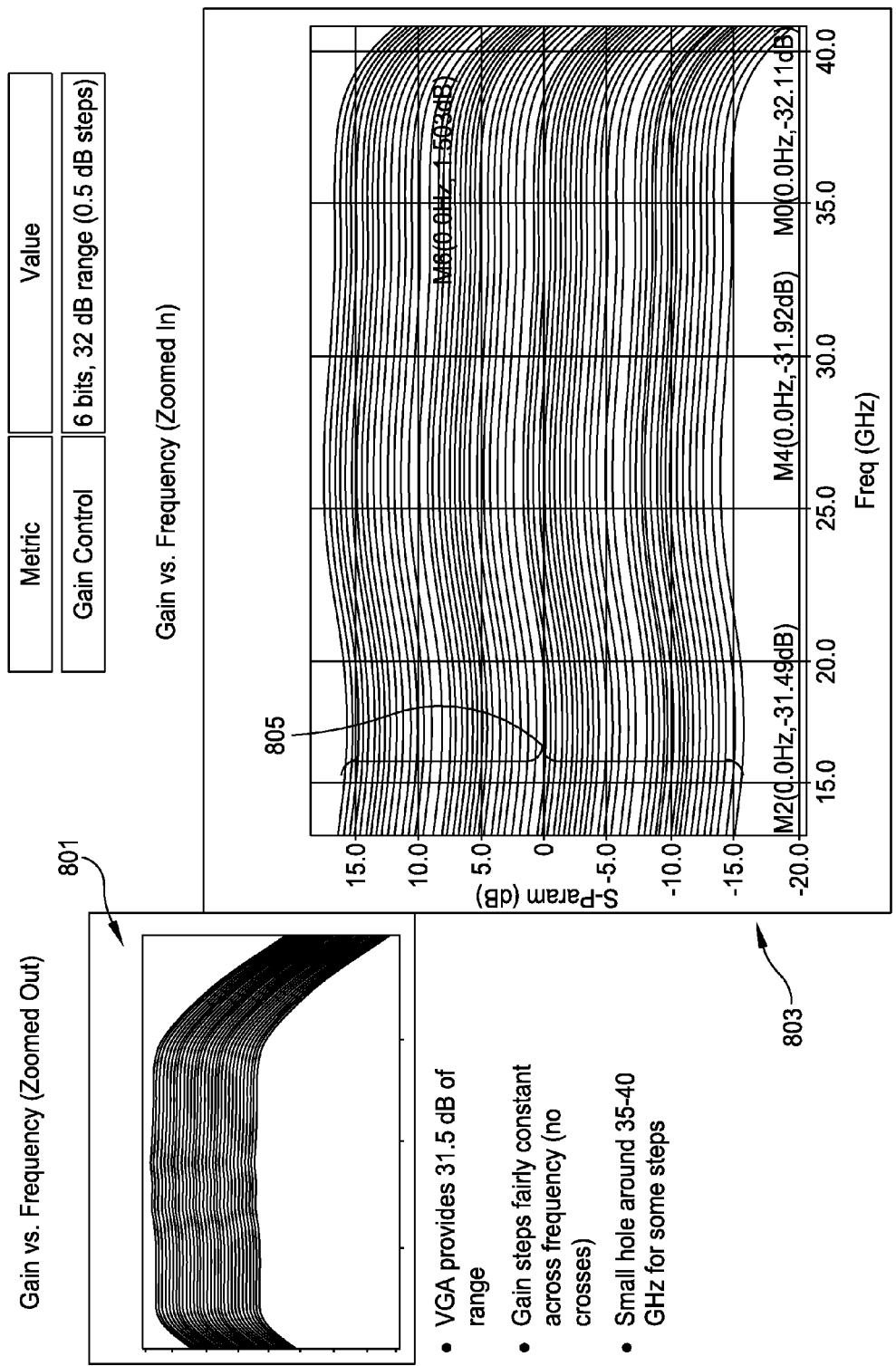
FIG. 8 is a graph showing gain versus frequency for a digitally controlled VGA according to an embodiment of the disclosure.

FIG. 8 is a graphical representation of Gain vs. Frequency for an exemplary VGA in accordance with an embodiment of the disclosure. As may be seen in graph 801 and the zoomed inset 803, concentrating on the frequency range between 15-41 GHz, an embodiment of a VGA in accordance with this disclosure produces a gain range 805 of 31.5 dB while providing substantially constant gain steps across frequencies with high gain step resolution provided by the stacked cascodes embodied by fine gain control circuit 115 and coarse gain control circuit 113 (shown in FIG. 1).

Figure 9:
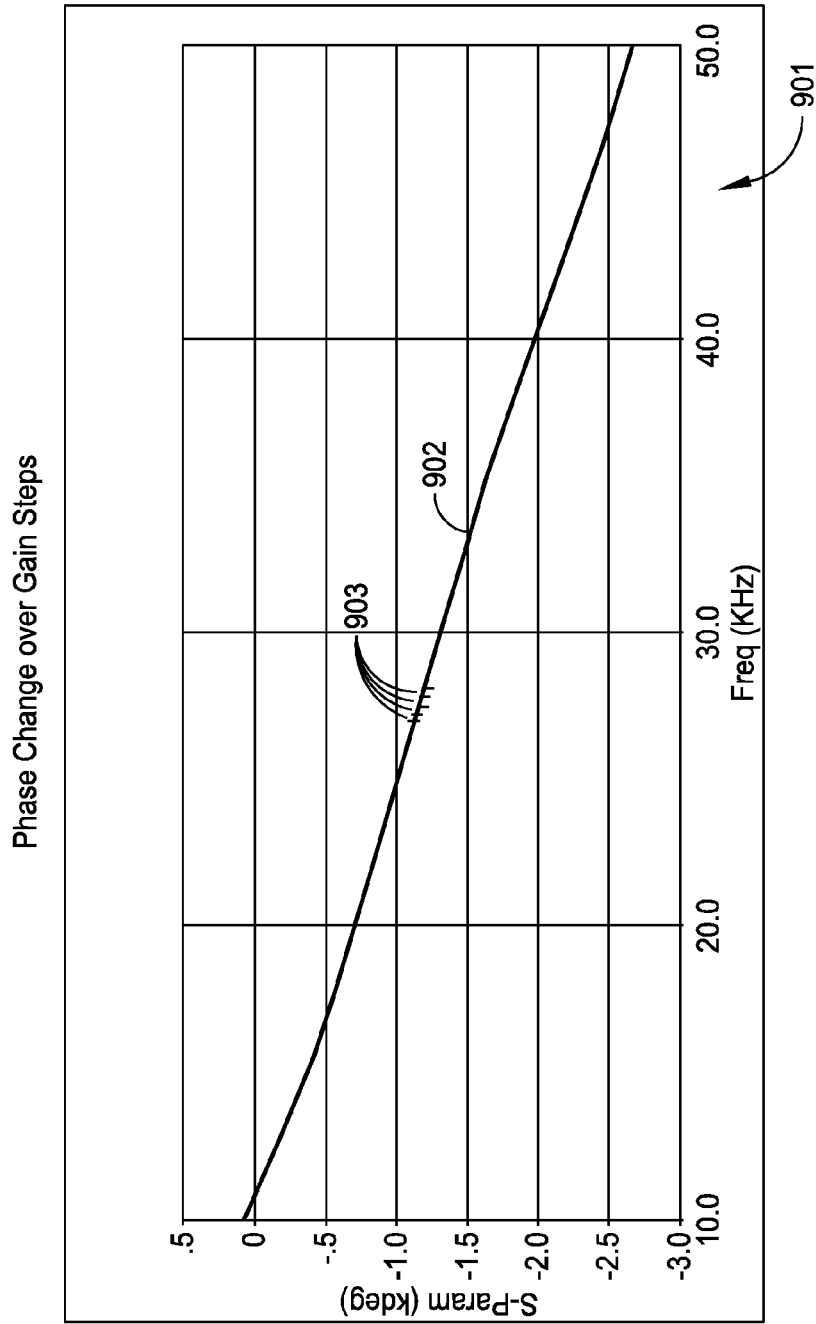
FIG. 9 is a graph showing phase change over gain steps for a digitally controlled VGA according to an embodiment of the disclosure.

FIG. 9 is a graphical representation of Phase Change over Frequency 901. Each gain step makes up a segment of curve 902. For each gain step 903, in a VGA according to an embodiment of the disclosure, a phase change of about 12 degrees is achieved.

Figure 10:
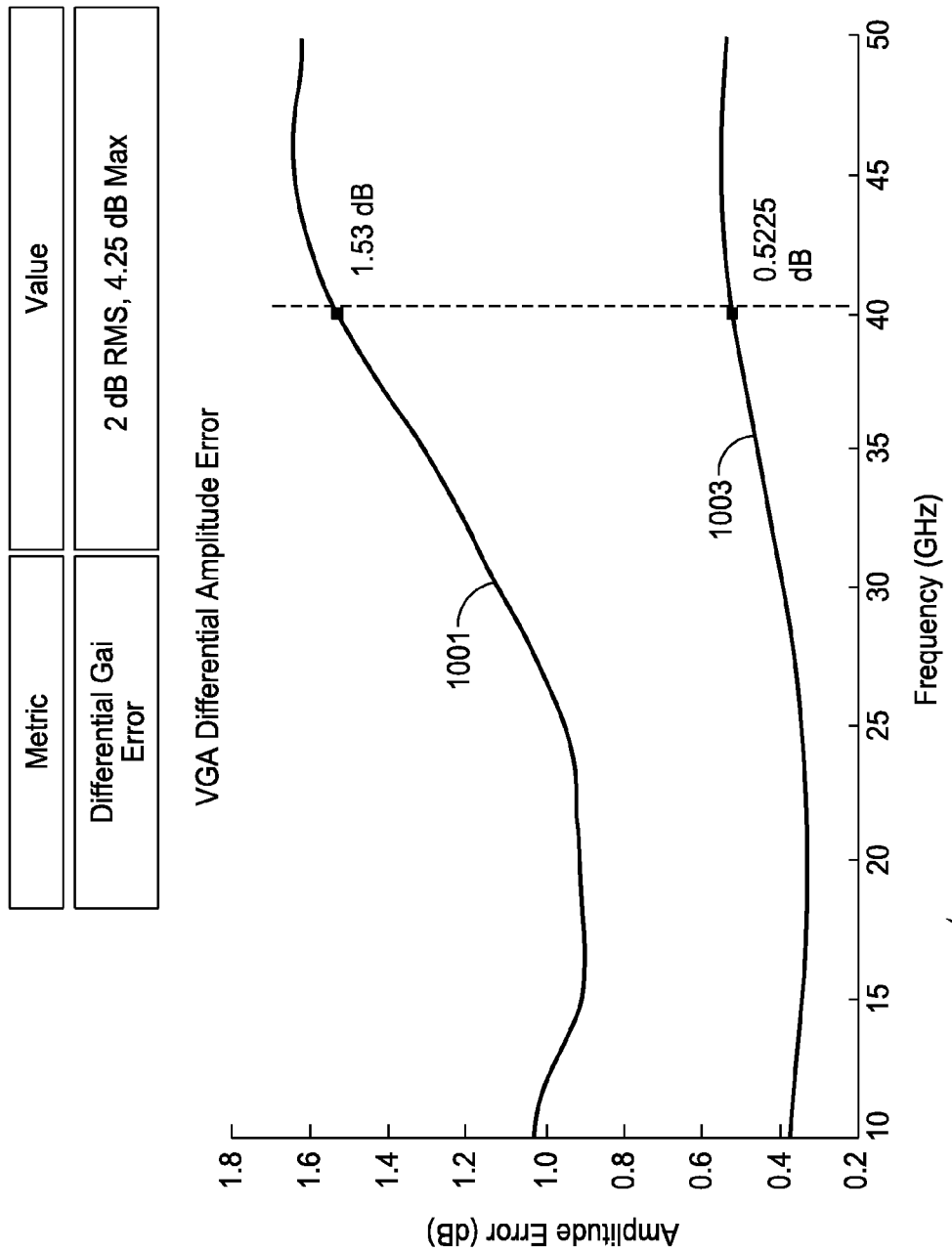
FIG. 10 is a graph showing VGA differential Amplitude Error for a digitally controlled VGA according to an embodiment of the disclosure.

FIG. 10 is a graphical representation 1000 of differential amplitude error as a function of frequency for an exemplary VGA according to an embodiment of the disclosure. For a requirement metric for a VGA operating at 40 GHz requiring an RMS differential error of 2 dB and a maximum differential error of 4.25 dB, an exemplary VGA in accordance with an embodiment of this disclosure experiences an RMS error (shown as curve 1003) of 0.5225 dB at 40 GHz, and a maximum differential error (shown as curve 1001) of 1.53 dB at 40 GHz.

Figure 11:
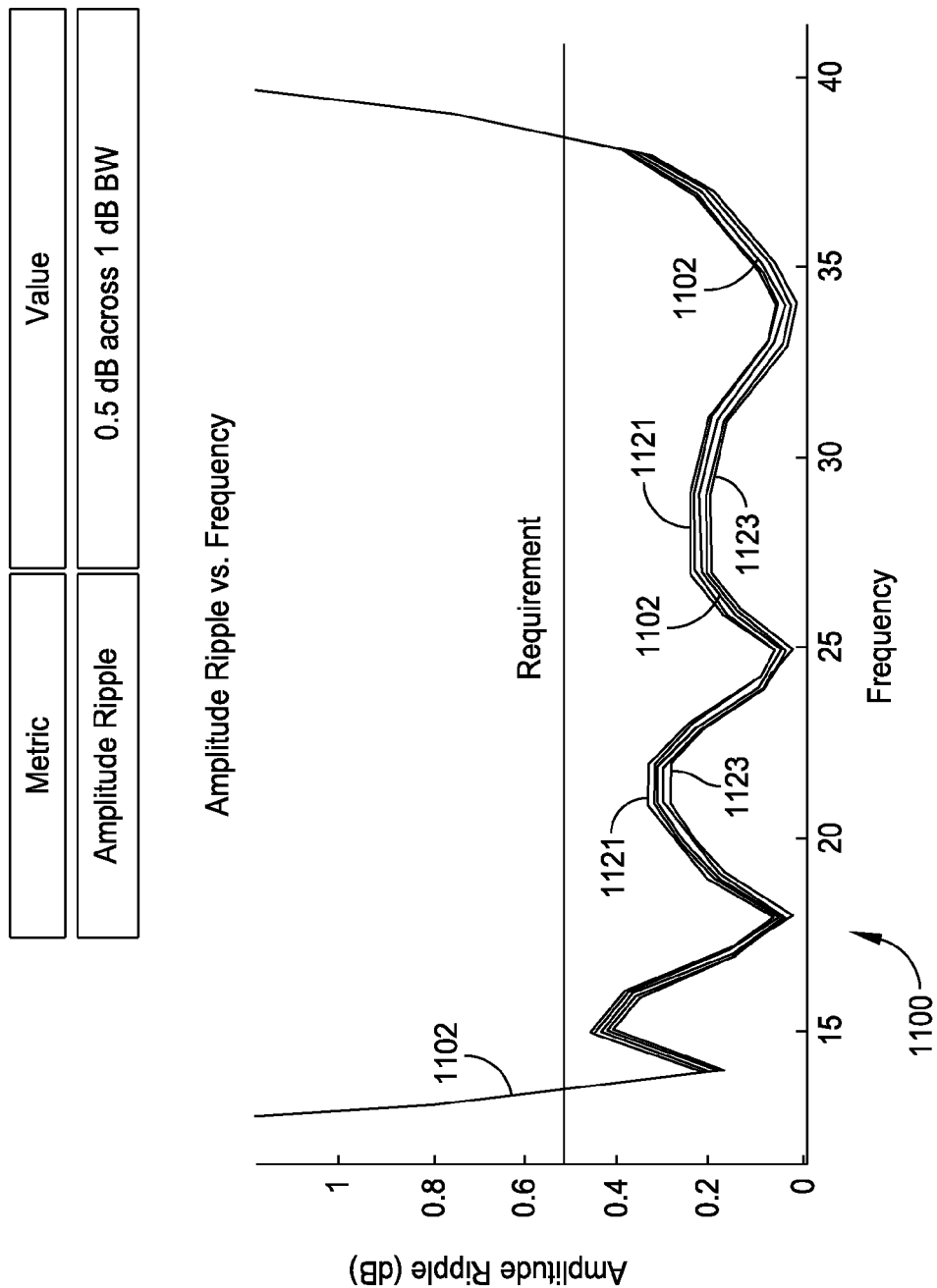
FIG. 11 is a graph showing amplitude ripple versus frequency for a digitally controlled VGA according to an embodiment of the disclosure.

FIG. 11 is a graphical representation of amplitude ripple 1100 for an exemplary VGA according to an embodiment of the disclosure. A VGA according to an embodiment of the disclosure produces an amplitude ripple that is below a 0.5 dB requirement for a bandwidth of 16 GHz to 39 GHz. The RMS ripple is shown as curve 1102. Each gain step produces a ripple as shown by curves 1121 depicting a first gain step and line 1123 depicting a second gain step of the exemplary VGA embodiment, by way of non-limiting example.

Although the circuit and method have been described in terms of exemplary embodiments, they are not limited thereto. Rather, the appended claims should be construed broadly, to include other variants and embodiments of the disclosed circuit and method, which may be made by those skilled in the art without departing from the scope and range of equivalents.

What is claimed is:

1. An integrated circuit implementing a variable gain amplifier (VGA) comprising:
    a pair of input transistors, each input transistor in the pair configured to receive a differential RF input signal;
    a fine gain control circuit configured to receive the differential RF input signal from a collector electrode of one of the input transistors in the pair of input transistors, wherein said fine gain control circuit is configured to steer at least a portion of the RF input signal to a downstream processing stage of the VGA;
    a coarse gain control circuit in the downstream processing stage configured to receive the at least a portion of the RF input signal from the fine gain control circuit, wherein the coarse gain control circuit steers at least a portion of the RF input signal provided by the fine gain control circuit to an output terminal of the VGA;
    wherein at least one of said fine gain control circuit and said coarse gain control circuit comprises a plurality of common base transistors.

2. The integrated circuit of claim 1, wherein said coarse gain control circuit is configured to produce a gain step of approximately 8 decibels (dB) and said fine gain control circuit is configured to provide gain control steps of 0.5 dB across a range corresponding to a given gain step of said coarse gain control.

3. The integrated circuit of claim 1, wherein said fine gain control circuit comprises;
    a feed line for conducting the differential RF input signal;
    a plurality of NPN transistor pairs connected in a cascode configuration, each NPN transistor pair comprising a first NPN transistor and a second NPN transistor, a collector electrode of the first NPN transistor electrically coupled to an input node of the coarse gain control circuit, and a collector electrode of the second NPN transistor electrically coupled to a voltage rail,
    wherein an emitter electrode of each NPN transistor of each NPN transistor pair is commonly connected to the feed line, and base electrodes of each NPN transistor pair is configured to receive a control signal, wherein the control signal applied to the first NPN transistor of the NPN transistor pair is the inverse of the control signal applied to the base electrode of the second NPN transistor of the NPN transistor pair.

4. The integrated circuit of claim 3, wherein the fine gain control circuit further comprises a voltage matching transistor between the collector electrodes of the second NPN transistors and the voltage rail.

5. The integrated circuit of claim 3, wherein the fine gain control circuit further comprises a NPN transistor connected in parallel with the plurality of NPN transistor pairs.

6. The integrated circuit of claim 3, wherein the coarse gain control circuit comprises:
    a second feed line for conducting the at least a portion of the RF input signal from the fine gain control circuit;
    a plurality of NPN transistor pairs connected in a cascode configuration, each NPN transistor pair comprising a first NPN transistor and a second NPN transistor, a collector electrode of the first NPN transistor electrically coupled to the output terminal of the VGA, and a collector electrode of the second NPN transistor electrically coupled to the voltage rail;
    wherein an emitter electrode of each NPN transistor of each NPN transistor pair is commonly connected to the second feed line, and base electrodes of each NPN transistor pair is configured to receive a control signal, wherein the control signal applied to the first NPN transistor of the NPN transistor pair is the inverse of the control signal applied to the base electrode of the second NPN transistor of the NPN transistor pair.

7. The integrated circuit of claim 6, wherein each NPN transistor is configured as a heterojunction bipolar transistor (HBT).

8. The integrated circuit of claim 6, wherein the base electrodes of each NPN transistor pair of the fine gain control circuit and the base electrodes of each NPN transistor pair of the coarse gain control circuit are connected to ground via a metal-insulator-metal (MIM) capacitor, and wherein an upper plate of the MIM capacitor comprises a ground plane.

9. The integrated circuit of claim 8, wherein the base electrodes of each NPN transistor of each NPN transistor pair of the fine gain control circuit and the coarse gain control circuit are connected to a control circuit by a bias resistor.

10. The integrated circuit of claim 8, wherein said control circuit is configured to generate a control word comprising a plurality of control bits, wherein a first subset of said plurality of control bits is applied to the base electrodes of each NPN transistor of each NPN transistor pair of said fine gain control circuit and a second subset of said plurality of control bits is applied to the base electrodes of each NPN transistor of each NPN transistor pair of said fine gain control circuit.

11. The integrated circuit of claim 10 wherein said control word comprises six bits, and wherein a four least significant bits of said control word are applied to the base electrodes of each NPN transistor of each NPN transistor pair of said fine gain control circuit and a two most significant bits of said control word are applied to the base electrodes of each NPN transistor of each NPN transistor pair of said fine gain control circuit.

12. The integrated circuit of claim 8, wherein for each NPN transistor pair of the fine gain control circuit, the MIM capacitor is positioned underneath the first feed line and the bias resistor coupled to the corresponding base electrode of each NPN transistor of the pair is positioned underneath the MIM capacitor.

13. A semiconductor device for implementing a digitally controlled variable gain amplifier (VGA), comprising:
a substrate defining a plurality of layers;
a plurality of NPN transistor pairs disposed on a lowermost layer of said substrate;
a feed line disposed on an uppermost layer between a first NPN transistor and a second NPN transistor of each NPN transistor pair;
a metal-insulator-metal (MIM) capacitor connected between ground and a base electrode of each NPN transistor making up one of the plurality of NPN transistor pairs, the MIM capacitor having a top conductive plate defining a ground plane, and wherein the MIM capacitor is disposed on a layer below the uppermost layer such that the MIM capacitor is positioned underneath the feed line;
a first bias resistor between the base electrode of the first NPN transistor of the NPN transistor pair and a control circuit, wherein the first bias resistor is positioned at a layer below the layer containing the MIM capacitor and the first bias resistor is situated underneath the MIM capacitor and the feed line;
a second bias resistor between the base electrode of the second NPN transistor of the NPN transistor pair and the control circuit, wherein the second bias resistor is positioned at a layer below the layer containing the MIM capacitor and the second bias transistor is situated underneath the MIM capacitor and the feed line;
wherein the plurality of NPN transistor pairs define a first group of NPN transistor pairs connected in a cascode configuration adapted to receive a radio frequency (RF) input signal and to provide a fine gain adjustment of the RF input signal, and a second group of NPN transistor pairs connected in a cascode configuration and adapted to receive the fine gain adjusted RF input signal from the first group of NPN transistor pairs and to output an amplified RF signal.

14. The semiconductor device of claim 13, further comprising a pair of input transistors configured to receive a differential RF input pair, the collector electrode of each input transistor coupled to the emitter electrodes of each NPN transistor in the first group of NPN transistor pairs.

15. The semiconductor device of claim 14, wherein the fine gain adjusted RF input signal is output to a node connected to the collector electrode of a first NPN transistor of each NPN transistor pair in the first group of NPN transistor pairs, the node further connected to the emitter electrodes of each NPN transistor in the second group of NPN transistor pairs.

16. A method of controlling gain in a variable gain amplifier (VGA), comprising the steps of:
applying a radio frequency (RF) input signal to an input terminal;
conducting said RF input signal to a fine gain control circuit, wherein said fine gain control circuit includes a first output and a second output;
selectively steering current in said fine gain control circuit such that a first portion of said RF input signal is steered to said first output of said fine gain control circuit and a second portion of said RF input signal is steered to said second output of said fine gain control circuit, wherein said first output of said fine gain control circuit is connected to an input of a coarse gain control circuit, and said second output of said fine gain control circuit is connected to a voltage rail;
configuring at least one of said fine gain control circuit and said coarse gain control circuit as a plurality of common base transistors; and
selectively steering said first portion of said RF input signal in said coarse gain control circuit, wherein said coarse gain control comprises a first output connected to an output terminal of said VGA and a second output connected to the voltage rail, such that a first portion of the RF input signal steered to the coarse gain control is further steered to the first output of said coarse gain control circuit and a second portion of the RF input signal steered to the coarse gain control is further steered to the second output of said coarse gain control circuit.

17. The method of claim 16, further comprising the steps of:
generating, in a control circuit, a control word comprising a plurality of control bits;
applying a first subset of said plurality of control bits said fine gain control circuit to selectively steer RF current through said fine gain control; and
applying a second subset of said plurality of control bits to said coarse gain control to selectively steer RF current through said coarse gain control.

18. The method of claim 17, wherein said fine gain control circuit comprises a plurality of NPN transistor pairs arranged in a cascode configuration and said coarse gain control circuit comprises a second plurality of NPN transistor pairs arranged in a cascode configuration and further comprising the steps of:
applying said first subset of control bits to a base electrode of each NPN transistor in each NPN transistor pair of said fine gain control circuit, wherein each control bit is applied to the base electrode of a first NPN transistor of the NPN transistor pair, and an inverse of the control bit is applied to the base electrode of a corresponding second NPN transistor of the NPN transistor pair; and
applying said second subset of control bits to a base electrode of each NPN transistor in each NPN transistor pair of said coarse gain control circuit, wherein each control bit is applied to the base electrode of a first NPN transistor of the NPN transistor pair, and an inverse of the control bit is applied to the base electrode of a corresponding second NPN transistor of the NPN transistor pair.

19. The method of claim 18, wherein said control word comprises six control bits, and further comprising the steps of:
applying each of four least significant bits of said control word to a corresponding base electrodes of a NPN transistor pair comprising said fine gain control circuit; and
decoding a two most significant bits of said control word and applying the decoded control bits to each base electrode of each NPN transistor comprising said coarse gain control circuit.

20. The method of claim 18, further comprising:
placing a NPN transistor in parallel with each of said plurality of NPN transistor pairs in said fine gain control; and
applying a control signal to said parallel NPN transistor, wherein said control signal is operative to maintain said parallel NPN transistor in a conducting state during operation of said VGA.

21. The integrated circuit of claim 1, wherein said fine gain control circuit is configured as a plurality of common base transistors.

22. The integrated circuit of claim 21, wherein said coarse gain control circuit is configured as a plurality of common base transistors.

23. The integrated circuit of claim 1, wherein said fine gain control circuit comprises a plurality of transistor pairs, wherein each transistor pair of said plurality of transistor pairs is configured to receive the differential RF input signal via said feed line and wherein each transistor pair of said plurality of transistor pairs is selectively controllable so as to pass via a first transistor of said transistor pair the applied RF input signal to a downstream stage of said integrated circuit, and to pass via a second transistor of said transistor pair the applied RF input signal to a voltage rail according to a control signal.

24. The integrated circuit of claim 1, wherein said coarse gain control circuit comprises a plurality of transistor pairs, wherein each transistor pair of said plurality of transistor pairs is configured to receive an output of said fine gain control circuit and wherein each transistor pair of said plurality of transistor pairs is selectively controllable so as to pass via a first transistor of said transistor pair the output of said fine gain control circuit to an output node of said integrated circuit, and to pass via a second transistor of said transistor pair the output of said fine gain control circuit to a voltage rail according to a control signal.

\* \* \* \* \*